(12) United States Patent
Wang et al.

(10) Patent No.: US 7,729,131 B2
(45) Date of Patent: Jun. 1, 2010

(54) MULTIPLE CIRCUIT BOARD ARRANGEMENTS IN ELECTRONIC DEVICES

(75) Inventors: Erik L. Wang, Redwood City, CA (US); Louie Sangunietti, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 682 days.

(21) Appl. No.: 11/650,122

(22) Filed: Jan. 5, 2007

(65) Prior Publication Data
US 2008/0165517 A1 Jul. 10, 2008

(51) Int. Cl.
H05K 9/00 (2006.01)

(52) U.S. Cl. .................. 361/818; 361/800; 361/816; 174/350; 174/377

(58) Field of Classification Search ............ 361/735, 361/818, 800, 816, 799, 753, 752; 174/350, 174/377
See application file for complete search history.

(56) References Cited

U.S. PATENT DOCUMENTS

| | | | |
|---|---|---|---|
| 4,437,718 A | | 3/1984 | Selinko |
| 4,979,075 A | | 12/1990 | Murphy |
| 5,373,189 A | * | 12/1994 | Massit et al. ............... 257/686 |
| 5,994,166 A | * | 11/1999 | Akram et al. ............... 438/108 |
| 6,051,878 A | * | 4/2000 | Akram et al. ............... 257/686 |
| 6,222,265 B1 | * | 4/2001 | Akram et al. ............... 257/723 |
| 6,404,044 B2 | * | 6/2002 | Akram et al. ............... 257/686 |
| 6,583,503 B2 | * | 6/2003 | Akram et al. ............... 257/686 |
| 6,690,582 B2 | * | 2/2004 | Sumida ...................... 361/752 |
| 6,768,654 B2 | * | 7/2004 | Arnold et al. ............... 361/818 |
| 6,979,895 B2 | * | 12/2005 | Akram et al. ............... 257/686 |
| 7,094,046 B2 | | 8/2006 | Tandy |
| 7,239,519 B2 | * | 7/2007 | Guo et al. .................... 361/714 |
| 7,365,992 B2 | * | 4/2008 | Lee ............................ 361/800 |

FOREIGN PATENT DOCUMENTS

JP 405308198 A * 11/1993
JP 2001-210785 A 8/2001

OTHER PUBLICATIONS

International Search Report, issued Jun. 12, 2008 in international application No. PCT/US2008/000213.

* cited by examiner

*Primary Examiner*—Dameon E Levi (57) ABSTRACT

Electronic devices can be provided with at least one first circuit component coupled to a first circuit board, at least one second circuit component coupled to a second circuit board, and a mating assembly coupled to the boards for holding them in a vertical stack. The first circuit components can face the second circuit components in the stack. One or more of the first circuit components can be horizontally offset from one or more of the second circuit components in the stack to reduce the thickness of the mated circuit boards. Portions of the circuit boards and the mating assembly can shield the circuit components of the stack from electromagnetic interference.

14 Claims, 8 Drawing Sheets

MULTIPLE CIRCUIT BOARD ARRANGEMENTS IN ELECTRONIC DEVICES

BACKGROUND OF THE DISCLOSURE

The present invention can relate to apparatus and methods for arranging multiple circuit boards in an electronic device.

In some cases, an electronic device can include a housing with one or more electrical circuit components and a circuit board. The circuit board can be used to mechanically support and electronically interconnect the one or more electrical circuit components of the device.

In some cases, high frequency communication signals can be transmitted and/or received by the device, and it is, therefore, generally desirable to shield the circuit board and its circuit components from electromagnetic interference (EMI) caused by such high frequency communication. However, the various amounts of electrical circuit components that may be coupled to the circuit board, as well as the one or more shielding layers that may be used to prevent EMI on the board, create significant challenges to manufacturing smaller and thinner electronic devices.

SUMMARY OF THE DISCLOSURE

Apparatus and methods for coupling and shielding multiple circuit boards in an electronic device are provided.

According to a particular embodiment of the present invention, an electronic device is provided that includes at least one first circuit component coupled to a first board, at least one second circuit component coupled to a second board, and a mating assembly coupled to the first board and the second board for holding the first board and the second board in a vertical stack. The one or more first circuit components can face the one or more second circuit components in the vertical stack. In certain embodiments, one or more of the first circuit components can be horizontally offset from one or more of the second circuit components in the vertical stack. In other embodiments, the tallest of the first components can be substantially adjacent the second board in the vertical stack.

BRIEF DESCRIPTION OF THE DRAWINGS

The above and other features of the present invention, its nature and various advantages will become more apparent upon consideration of the following detailed description, taken in conjunction with the accompanying drawings, in which like reference characters refer to like parts throughout, and in which.

DETAILED DESCRIPTION OF THE DISCLOSURE

Apparatus and methods for arranging multiple circuit boards in an electronic device are provided and described with reference to FIGS. 1-8.

FIGS. 1-6 illustrate an exemplary electronic device that can incorporate the present invention. The term "electronic device" can include, but is not limited to, music players, video players, still image players, game players, other media players, music recorders, video recorders, cameras, other media recorders, radios, medical equipment, calculators, cellular telephones, other wireless communication devices, personal digital assistants, remote controls, pagers, laptop computers, printers, or combinations thereof. In some cases, the electronic devices may perform a single function (e.g., an electronic device dedicated to playing music) and, in other cases, the electronic devices may perform multiple functions (e.g., an electronic device that plays music, displays video, stores pictures, and receives and transmits telephone calls).

In any case, these electronic devices are generally any portable, mobile, hand-held, or miniature electronic device that may allow a user to listen to music, play games, record videos, take pictures, and/or conduct telephone calls, for example, wherever the user travels. Miniature electronic devices may have a form factor that is smaller than that of hand-held electronic devices, such as an iPod™ available by Apple Computer, Inc. of Cupertino, Calif. Illustrative miniature electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof. Alternatively, electronic devices of the present invention may not be portable at all.

Figure 1:
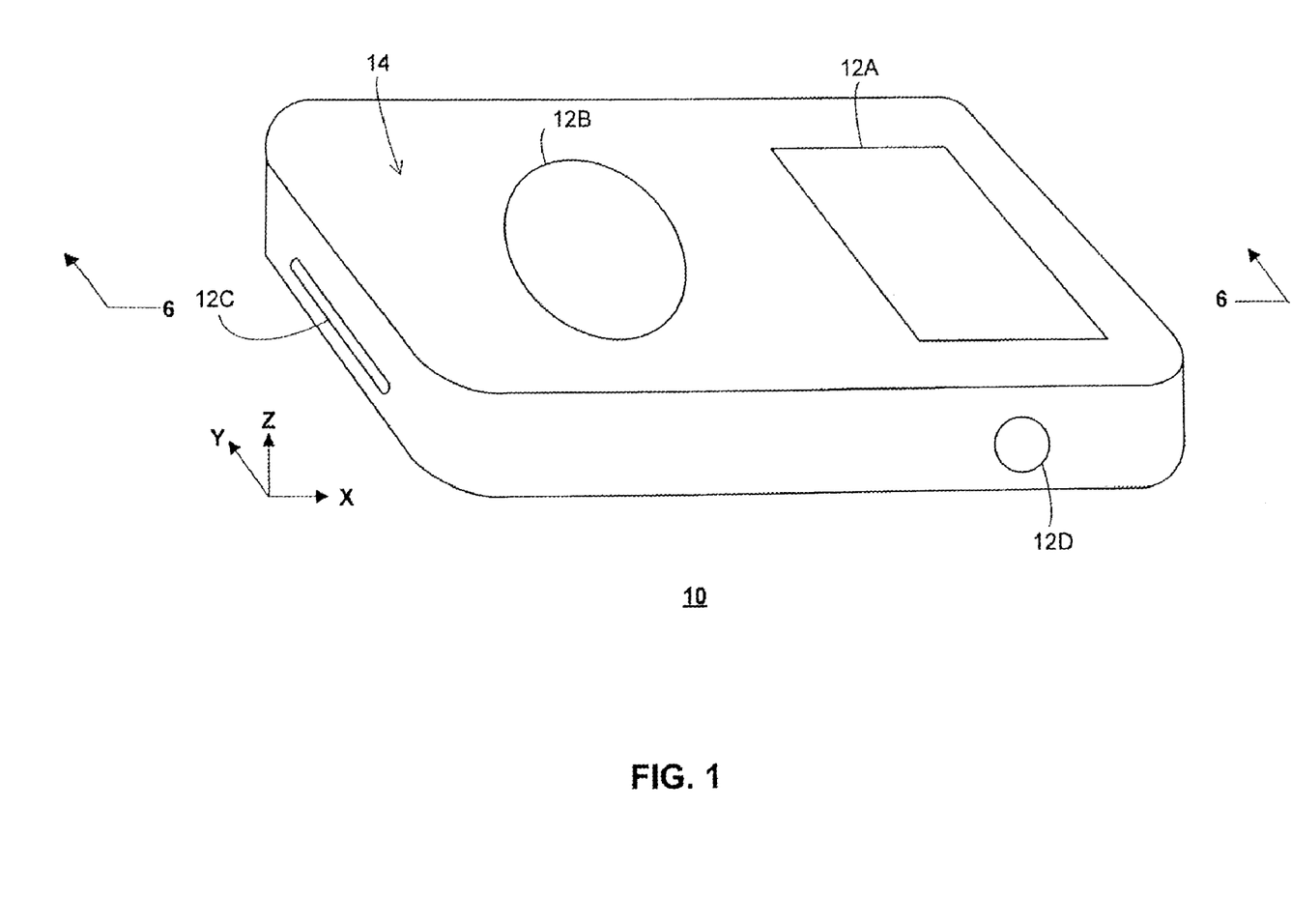
FIG. 1 is a perspective view of an exemplary electronic device in accordance with the principles of the present invention.

Electronic device 10 can have one or more input/output (I/O) components, such as I/O components 12A-12D, at least partially disposed within a housing 14. The I/O components can include any type of component that receives and/or transmits digital and/or analog data (e.g., audio data, video data, radio frequency data, other types of data, or a combination thereof). For example, I/O component 12A may be a display that provides graphic images to a user, I/O component 12B may be a user input component that can permit a user to input data into the electronic device, I/O component 12C may be an antenna that can permit electronic device 10 to interact with a computer or other device, and I/O component 12D may be a media input/output connector that can communicate media data to an accessory. Accessories can include, but are not limited to, docks, printers, external storage devices, external displays, speakers, lanyards having headphones and microphones coupled thereto, and other audio and/or visual input/output devices.

In one embodiment, I/O component 12B may be a scroll wheel similar to that used by the iPod™ device, which may include one or more buttons for selecting software entries and a capacitive touchpad. In other alternative embodiments, user I/O component 12B may include, for example, one or more buttons, a touchpad, a touch-screen display, electronics for accepting voice commands, infrared ports, ejectable smart card assemblies, or combinations thereof.

In one embodiment of the present invention, I/O component 12C may be an antenna capable of transmitting and receiving data from a computer or another device. In another embodiment, component 12C may be a multiple-pin connector having 30 pins, for example, that transmit data to and from the electronic device. Media connector I/O component 12D can include, for example, an audio connector that transmits audio data to speakers or headphones and/or receives audio data from a microphone. Alternatively, media connector 12D can transmit and/or receive, for example, video data, still image data, games data, or other media data known in the art or otherwise. Media connector 12D also can transmit and/or receive combinations of media data.

Figure 2:
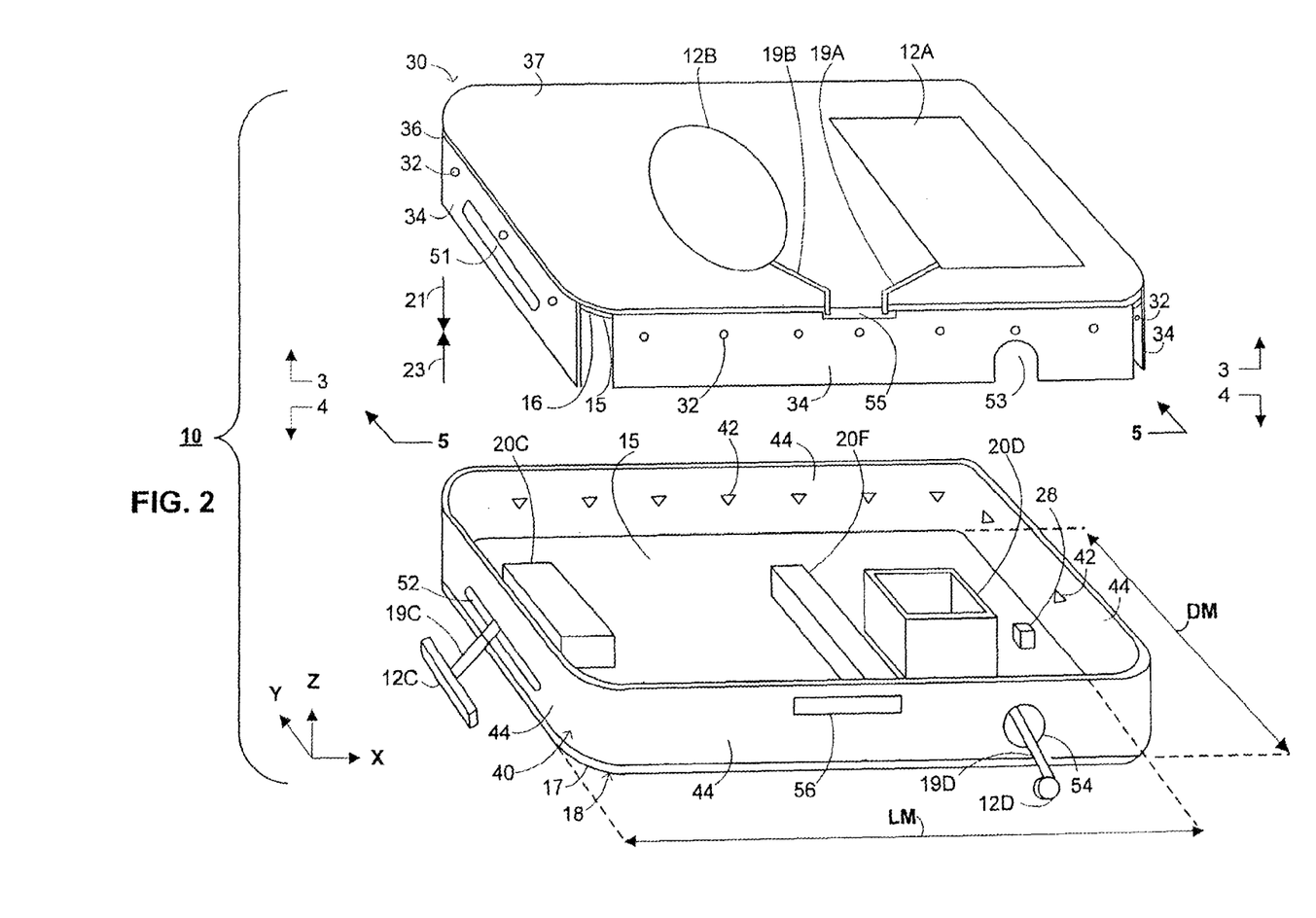
FIG. 2 is an exploded perspective view of the electronic device of FIG. 1, but with the housing omitted.
Figure 3:
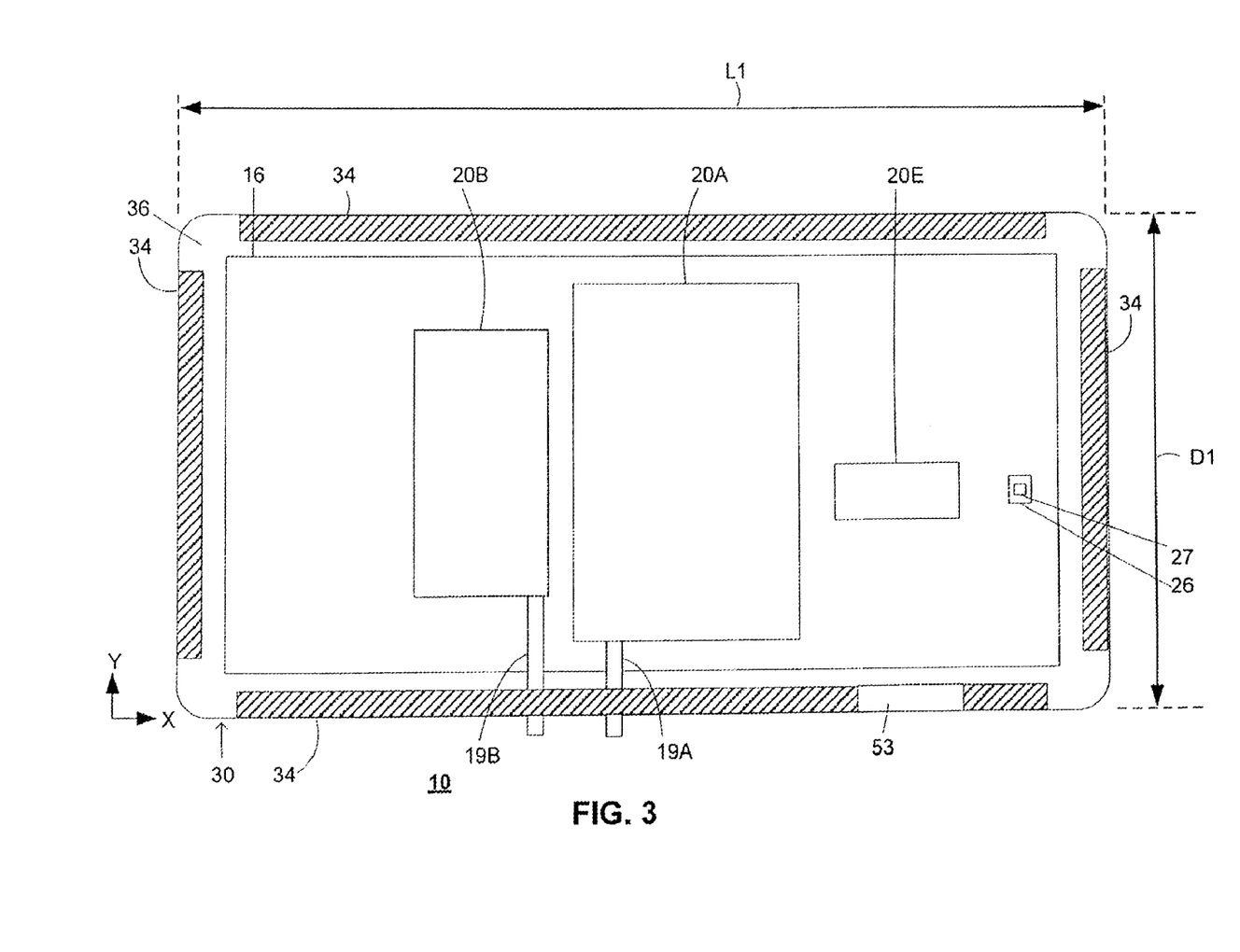
FIG. 3 is a horizontal cross-sectional view of a portion of the electronic device of FIGS. 1 and 2, taken from line 3-3 of FIG. 2.
Figure 4:
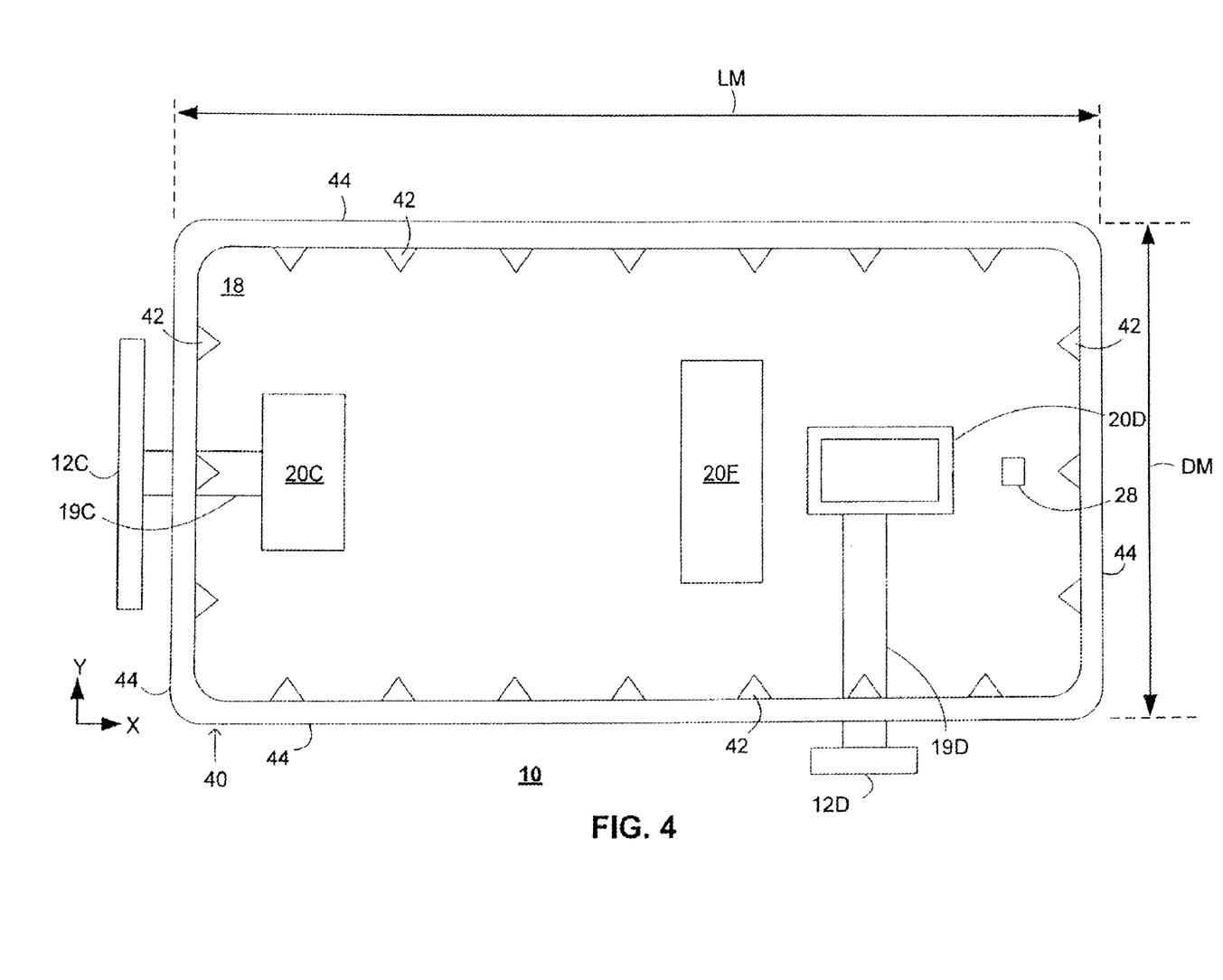
FIG. 4 is a horizontal cross-sectional view of a portion of the electronic device of FIGS. 1-3, taken from line 4-4 of FIG. 2.

Housing 14 of electronic device 10 can be designed to protect the I/O components (e.g., I/O components 12A-12D), one or more electrical circuit components, and at least two circuit boards coupled thereto. For example, as shown in FIG. 2, each of I/O components 12A-12D may be coupled to respective electrical circuit components 20A-20D of one or both of two circuit boards 16 and 18, via respective coupling circuits 19A-19D. Each of coupling circuits 19A-19D can be any flexible printed circuit (FPC), including one-sided, double-sided, multi-layer, dual access, rigid-flex FPCs, or combinations thereof. In alternative embodiments, any of coupling circuits 19A-19D can be replaced with ribbon cables, other types of cables, wires, other types of data transmission lines, or combinations thereof.

In one embodiment, each of I/O components 12A-12D and electrical circuit components 20A-20D can be coupled to a respective end of its respective coupling circuit 19A-19D using surface mount technology (SMT), soldering techniques, or through-hole constructions. In alternative embodiments, each I/O component 12 and/or electrical circuit component 20 can be electrically coupled to an end of its respective coupling circuit 19 using other methods known in the art or otherwise. Therefore, when I/O components 12 are physically and electrically coupled to electrical circuit components 20 of boards 16 and 18 via coupling circuits 19, one or more of boards 16 and 18 may communicate with each of I/O components 12 of device 10 concurrently in order for the device to function properly.

In addition to each of electrical circuit components 20A-20D that may be coupled to a respective I/O component via a respective coupling circuit, device 10 may also include additional electrical circuit components 20 coupled to the two or more circuit boards. For example, device 10 can also include electrical circuit component 20E coupled to circuit board 16 (see, e.g., FIG. 3) and electrical circuit component 20F coupled to circuit board 18 (see, e.g., FIG. 4). While each one of electrical circuit components 20A-20D may be of any suitable type of I/O communications circuitry, each of additional electrical circuit components 20E and 20F may be of any suitable type of circuitry, including, but not limited to, a processor, a storage device, communications circuitry, a bus, a power supply for powering the device, or any combination thereof, for example.

A bus circuit component 20 of device 10 may provide a data transfer path for transferring data, to, from, or between at least a processor, a storage device, and/or communications circuitry. A processor circuit component 20 of device 10 may control the operation of many functions and other circuitry included in the device 10. For example, a processor component may receive user inputs from I/O component 12B via electrical circuit component 20B and drive I/O component 12A via electrical circuit component 20A. Alternatively, a processor component may be a codec, an analog-to-digital converter, a digital-to-analog converter, or any other suitable type of processor, for example.

A storage device circuit component 20 of device 10 may include one or more storage mediums, including, for example, a hard-drive, a permanent memory such as ROM, a semi-permanent memory such as RAM, or cache, that may store media (e.g., music and video files), software (e.g., for implementing functions on device 10), wireless connection information (e.g., information that may enable device 10 to establish wireless communication with another device or server), subscription information (e.g., information that keeps track of podcasts, television shows, or other media that the user subscribes to), and any other suitable data.

A communications circuitry component 20 of device 10 may include circuitry for wireless communication (e.g., short-range and/or long-range communication). For example, the wireless communication circuitry of device 10 may be wi-fi enabling circuitry that permits wireless communication according to one of the 802.11 standards. Other wireless protocol standards could also be used, either in alternative or in addition to the identified protocol. Another network standard may be Bluetooth®.

A communications circuitry component 20 may also include circuitry that enables device 10 to be electrically coupled to another device (e.g., a computer or an accessory device) and communicate with that other device. Furthermore, additional types of electrical circuit components 20 may be provided by device 10 for sending and receiving media, including, but not limited to, microphones, amplifiers, digital signal processors (DSPs), image sensors (e.g., charge coupled devices (CCDs)) or optics (e.g., lenses, splitters, filters, etc.), receivers, transmitters, transceivers, and the like.

Each of the plurality of circuit boards (e.g., boards 16 and 18) of the present invention can be any type of board, including, but not limited to, printed circuit boards (PCBs), logic boards, printed wiring boards, etched wiring boards, and other known boards, that may be used to mechanically support and electronically connect the one or more electrical circuit components (e.g., electrical circuit components 20) coupled thereto. Each circuit board may be constructed using one or more layers of a non-conductive substrate and signal conducting pathways.

The signal conducting pathways can exist in one or more layers or in each layer of the non-conductive substrate. The signal conducting layers, sometimes referred to as traces, members, or leads, may be a metal conductive material (e.g., copper or gold) or an optical conductive material (e.g., fiber optics).

In order to manufacture device 10 with a smaller surface area, rather than coupling all of components 20 on one larger circuit board, electrical circuit components 20 can be coupled to one of two smaller circuit boards 16 and 18 that may be stacked on top of one another. By placing some of components 20 on a first board (e.g., components 20A, 20B, and 20E on a first side 15 of board 16) and some of components 20 on a second board (e.g., components 20C, 20D, and 20F on a first side 15 of board 18), the total surface area consumed by the boards can be reduced when the boards are stacked.

The total surface area created by two circuit boards in a stacked combination is considerably less than the total surface are created by the same two boards placed side by side in substantially the same plane. For example, the surface area created by boards 16 and 18 in a stacked configuration (see, e.g., the surface area created by length LM and depth DM of FIGS. 2 and 4) is by at least a factor less than the total surface area created by boards 16 and 18 when they are merely placed side by side in substantially the same plane (not shown, but see, e.g., the total of not only the surface area created by length LM and depth DM of FIGS. 2 and 4 but also the surface area created by length L1 and depth D1 of FIG. 3). Therefore, by splitting up components 20 of device 10 amongst two or more circuit boards, not only may the surface area of each board be reduced due to the lower number of components on that individual board, but the total surface area of the device may also be reduced by stacking the two smaller circuit boards on top of one another as opposed to placing them side by side.

In certain embodiments, one or more of the plurality of circuit boards, as well as the circuit components coupled thereto, can be designed specifically for one or more particular purpose and can be entirely self-reliant. For example, circuit board 16 and components 20 coupled thereto (e.g., components 20A, 20B, and 20E) can be specifically designed and dedicated to recording and playing music, while circuit board 18 and components 20 coupled thereto (e.g., components 20C, 20D, and 20F) can be specifically designed and dedicated to receiving and transmitting wireless communications. In certain embodiments, one or more of such specifically designed boards (e.g., boards 16 and 18) may be completely independent and may not need or be able to share any capabilities or circuit components 20 with the other board or boards of the device.

These specifically designed and dedicated circuit boards can be smaller and require less electrical circuit components 20 than more generic boards that are designed to facilitate many various types of functions (e.g., playing music, displaying videos, taking pictures, and receiving telephone calls). Therefore, by splitting up components 20 of device 10 amongst two or more stacked circuit boards, not only may the surface areas of each board and the entire device be reduced, but the utility of the device may be enhanced as well.

While stacking the circuit boards can reduce the total surface area of the boards within the device, this stack may consequentially increase the total height or thickness of the circuit boards. Therefore, rather than stacking the circuit boards such that their respective circuit components extend away from or in the same direction as each other, the circuit boards may be stacked with their respective circuit components extending towards each other in order to reduce the total thickness of the circuit board stack. As shown in FIGS. 2-6, for example, each of electrical circuit components 20 may be coupled to first side 15 of one of circuit boards 16 or 18 such that, when the two boards are stacked together with first sides 15 facing each other, circuit components 20 on board 16 are extending therefrom and towards circuit components 20 on board 18, and vice versa.

Device 10 can also be provided with a mating assembly for holding two or more boards in a vertical stack according to the present invention. In certain embodiments, each of any two circuit boards to be stacked can be provided with one or more of its own circuit board mating components of a mating assembly. A circuit board mating component from each of two circuit boards can interact so as to hold those two circuit boards in a fixed relationship with their respective electrical circuit components facing each other, as described above. As shown in FIGS. 2-6, for example, device 10 can be provided with a mating assembly that includes a board mating component 30 coupled to circuit board 16 and a board mating component 40 coupled to circuit board 18.

In one embodiment, board mating component 30 can include a base portion 36 and one or more side portions 34 extending therefrom. As shown in FIGS. 2, 3, 5, and 6, for example, second side 17 of circuit board 16 can be coupled to first side 35 of base portion 36, and four side portions 34 may extend from first side 35 of base portion 36 about board 16. Second side 17 of board 16 may be coupled to first side 35 of base portion 36 by any suitable technique, including, but not limited to, adhesives, soldering, screw points, fingers secured with metal screws or any other securable pressure/force device (e.g., rivets, nails, pins) or bonding agent or glue or laser welding or spot welding, or combinations thereof. In alternative embodiments, two or more sides 34 may be spaced such that board 16 can be held in a tight fit therebetween and against base portion 36.

Board mating component 40 can be similar to board mating component 30 and can include a base portion and one or more side portions extending therefrom. In an alternative embodiment, there may be no base portion and board mating component 40 can include one or more side portions 44 extending from first side 15 of circuit board 18. As shown in FIGS. 2 and 4-6, for example, four side portions 44 may extend from first side 15 of circuit board 18 about circuit components 20 coupled thereto. In one embodiment, as shown in FIGS. 2 and 4-6, side portions 44 may continuously surround circuit components 20 of board 18. In an alternative embodiment, just as each of side portions 34 may be individually coupled to base portion 36 of mating component 30, one or more of side portions 44 may be separately and independently coupled to board 18. First side 15 of board 18 may be coupled to side portions 44 of mating element 40 by any suitable technique, including, but not limited to, adhesives, soldering, screw points, fingers secured with metal screws or any other securable pressure/force device (e.g., rivets, nails, pins) or bonding agent or glue or laser welding or spot welding, or combinations thereof.

Figure 5:
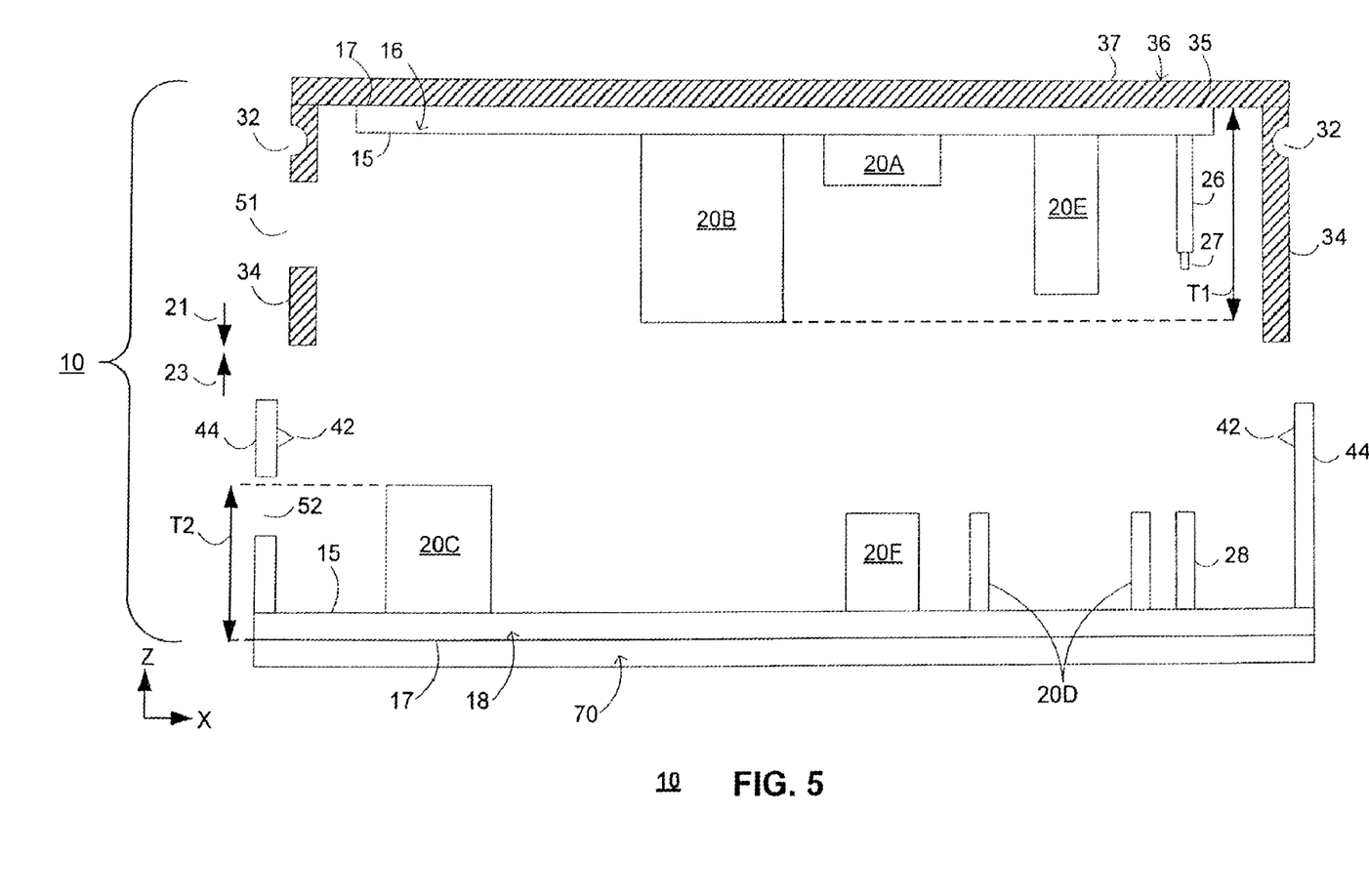
FIG. 5 is a vertical cross-sectional view of a portion of the electronic device of FIGS. 1-4, taken from line 5-5 of FIG. 2.
Figure 6:
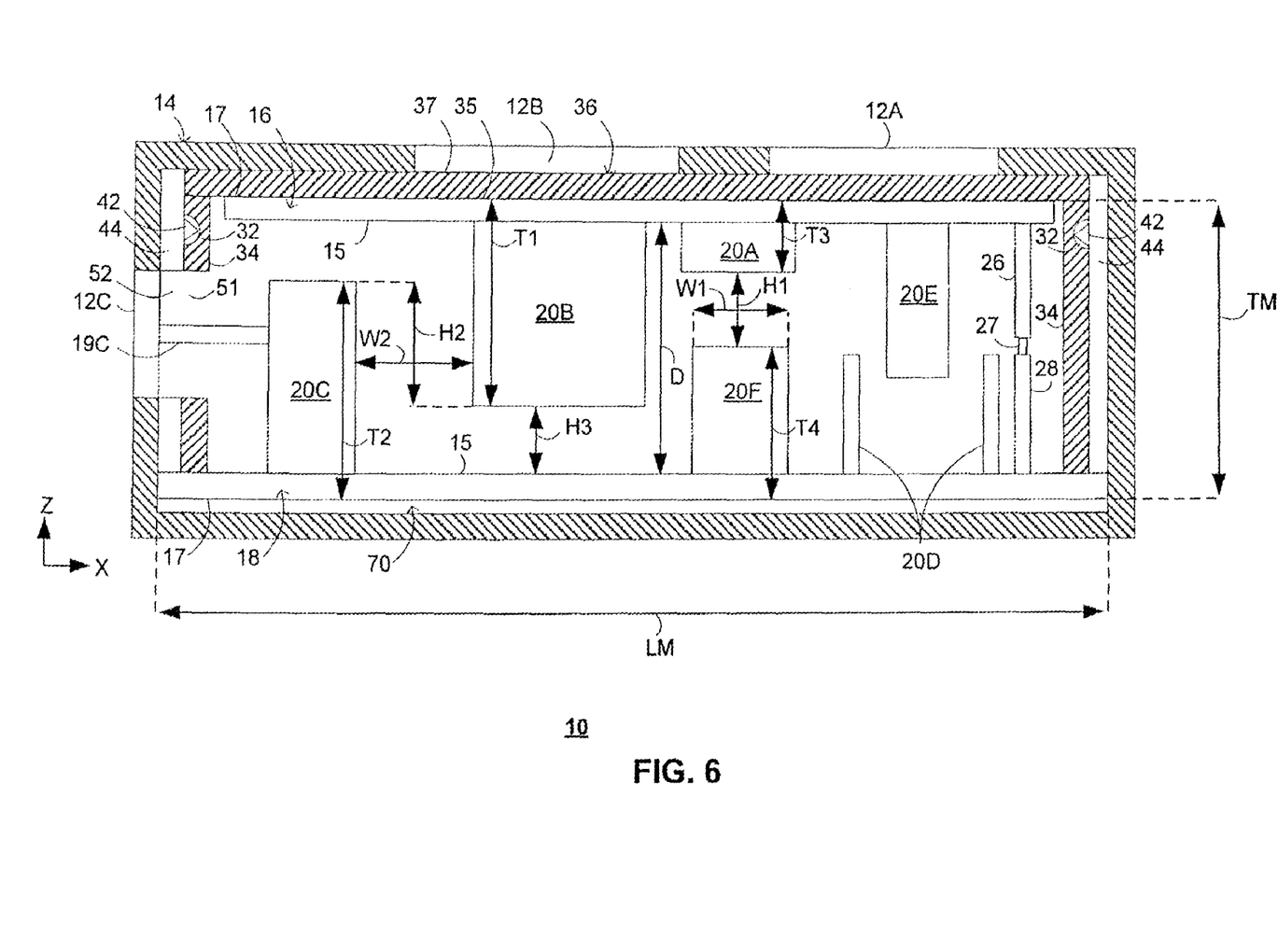
FIG. 6 is a vertical cross-sectional view of the electronic device of FIGS. 1-5, taken from line 6-6 of FIG. 1.

Each of mating components 30 and 40 may be provided with corresponding mating elements that can interact to hold the two circuit boards together in a stacked relationship. As shown in FIGS. 2, 5, and 6, for example, board mating component 30 may be provided with one or more board mating elements 32 along the outer side of one or more of side portions 34. Likewise, board mating component 40 may be provided with one or more board mating elements 42 along the inner side of one or more of side portions 44.

When mating elements 32 and 42 interact, they can retain mating components 30 and 40, and, thus boards 16 and 18, in a mated stack. For example, as shown in FIG. 6, when boards 16 and 18 are moved towards each other in the directions of arrows 21 and 23, respectively (see, e.g., FIGS. 2 and 5), the outer sides of mating component 30 can slide against the inner sides of mating component 40 such that mating elements 32 and 42 can interact and thereby hold boards 16 and 18 in a fixed and mated relationship.

In one embodiment, as shown in FIGS. 2-6, mating elements 32 can be notches or grooves formed in side portions 34 and mating elements 42 can be nubs or balls protruding from side portions 44. In an alternative embodiment, mating elements 32 and 42 may be provided as any suitable interlocking mechanism or technique for holding boards 16 and 18 in their mated combination, including, but not limited to, snap-fit, threaded fastener, glue, soldering, bonding agent, or combinations thereof. In yet another alternative embodiment, one or both of mating components 30 and 40 may not include its respective mating element 32 or 42. Instead, the geometries of sides 34 and 44 can be such that they themselves create a tight fit with one another, and the tension between sides 34 and 44 can hold components 30 and 40, and, thus, boards 16 and 18, in their mated position.

Openings, cut-outs, or holes can also be provided in one or more portions of the mating components for passing coupling circuits between respective circuit components internal to the mated circuit board stack and respective I/O components external thereto. For example, as shown in FIGS. 2-6, openings 51 and 52 can be respectively provided in portions of mating components 30 and 40 such that, when boards 16 and 18 are in a mated stack (see, e.g., FIG. 6), openings 51 and 52 can align and pass coupling circuit 19C therethrough. Similarly, openings 53 and 54 can be respectively provided in portions of mating components 30 and 40 such that, when boards 16 and 18 are in a mated stack, openings 53 and 54 can align and pass coupling circuit 19D therethrough. Likewise, openings 55 and 56 can be respectively provided in portions of mating components 30 and 40 such that, when boards 16 and 18 are in a mated stack, openings 55 and 56 can align and pass coupling circuits 19A and 19B therethrough.

The geometries of mating components 30 and 40 can be such that their fixed and mated relationship may hold boards 16 and 18 apart from one another by a distance D. This distance may ensure that no electrical components of one board contact the other circuit board or the components thereon when the two boards are stacked by their mating components.

Distance D can be any distance that maintains at least a minimal vertical offset distance in the Z-direction between any two components of different boards that are at least partially aligned in each of the X- and Y-directions (i.e., at least partially horizontally aligned). For example, as shown in FIGS. 3-6, despite component 20A of board 16 being partially aligned with component 20F of board 18 in the Y-direction and also in the X-direction (e.g., by overlapping width W1 of FIG. 6), distance D may maintain at least a minimal vertical offset distance H1 in the Z-direction between components 20A and 20F.

Distance D can also be any distance that maintains at least a minimal vertical offset distance in the Z-direction between any component of one board and another board itself when that component is not at least partially aligned with a component of the other board in each of the X- and Y-directions (i.e., at least partially horizontally aligned). For example, as shown in FIGS. 3-6, despite component 20B of board 16 not being at least partially aligned with any component 20 of board 18 in either the X- or Y-directions, distance D may maintain at least a minimal vertical offset distance H3 in the Z-direction between component 20B and circuit board 18 (see, e.g., FIG. 6).

This distance D provided by mating components 30 and 40 between boards 16 and 18 can mitigate the potential for one or more of components 20 of one circuit board to short by contacting a component 20 of another board or that other board itself. In certain embodiments, distance D may be great enough so as to absorb any potential compression of the distance between boards 16 and 18 (and, e.g., distances H1 and H3) that may occur due to compressive forces of the user sitting on the device, for example.

Figure 7:
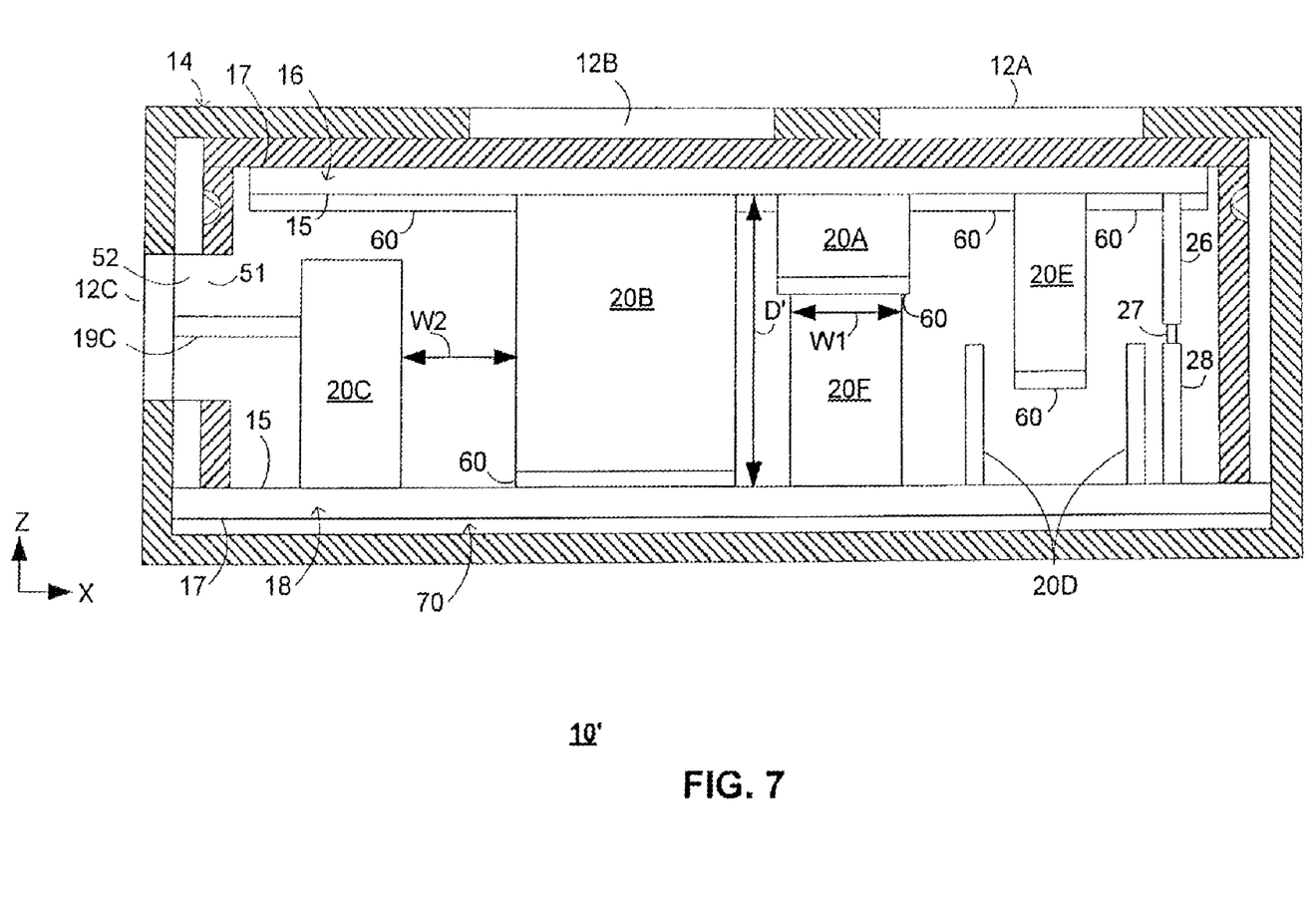
FIG. 7 is a vertical cross-sectional view, similar to FIG. 6, of an alternative embodiment of an electronic device in accordance with the principles of the present invention.

In an alternative embodiment, any suitable non-conductive insulating material may be provided on components 20 and/or side 15 of at least one of circuit boards 16 and 18 to mitigate the potential for shorting of the device due to unintended compression of the circuit board stack. For example, as shown in FIG. 7, a device 10' can be provided that may be substantially the same as device 10, but that also can include layer 60, which may be made of any suitable non-conductive insulating material, on top of first side 15 of circuit board 16 and components 20 coupled thereto.

In certain embodiments, distance D1 of device 10' may not maintain a minimal vertical offset distance between any two components of different boards that are at least partially horizontally aligned (e.g., minimal vertical offset distance H1 between components 20A and 20F of FIG. 6) because layer 60 itself can be adequate to mitigate any potential short-circuits therebetween. Also, in certain embodiments, distance D' of device 10' may not maintain a minimal vertical offset distance between any component of one board and another board itself when that component is not at least partially horizontally aligned with a component of the other board (e.g., minimal vertical offset distance H3 between component 20B and circuit board 18 of FIG. 6) because layer 60 itself can be adequate to mitigate any potential short-circuits therebetween.

Non-conductive layer 60 may also include a compressible material, such as, but not limited to, a gel, foam, or sponge, and/or include a compressive device, such as a spring. The damping effect of the compressible material of non-conductive layer 60 may protect electronic device 10 from compressive forces applied thereto. In certain embodiments, compressible layer 60 can augment or absorb any potential compression of the distance between boards 16 and 18 that may occur due to compressive forces of the user sitting on the device, for example.

Even though the boards are mated together, the thickness of the mated combination, and, therefore, distance D, for example, can be minimized. This thickness can be minimized by selectively placing the electrical circuit components on each board such that at least certain circuit components coupled to the first board (e.g., extending away from the board in the Z-direction) are not opposed by or vertically in line with at least other certain circuit components coupled to the second board (e.g., are not at least partially horizontally aligned).

For example, if a first board has a centrally located stack of circuit components (see, e.g., component 20E of board 16), the second board may have peripherally located vertical stacks of circuit components (see, e.g., component 20D of board 18) that, when the boards are mated together, are adjacent to the centrally located circuit component. Therefore, by not opposing or being vertically in line with one another, components 20D and 20E, for example, can reduce the thickness of their vertical stack from that of a vertical stack in which components 20D and 20E do oppose or are vertically in line with one another.

To reduce the total thickness of this circuit board stack, in one embodiment, components 20 can be selectively placed on the circuit boards in such a way that at least the component extending the greatest distance from one of the circuit boards may be horizontally offset from the component extending the greatest distance from the other of the circuit boards. For example, as shown in FIGS. 2-6, component 20B may vertically extend away from its circuit board 16 in the Z-direction to the greatest distance T1, and component 20C may vertically extend away from its circuit board 18 in the Z-direction to the greatest distance T2. To reduce the thickness of the circuit board stack (e.g., to reduce distance D), component 20B may be horizontally offset from component 20C in the Y-direction and the X-direction (e.g., by an offset width W2 of FIG. 6), despite those components vertically overlapping in the Z-direction by an overlapping height H2.

By selectively placing components 20 on the circuit boards such that at least the tallest components 20B and 20C on their respective boards 16 and 18 are horizontally offset from one another, the thickness of the circuit board stack can be reduced. As shown, in FIG. 6, for example, the thickness between second sides 17 of boards 16 and 18 in their mated configuration (see, e.g., mated thickness TM) can be considerably less than the sum of the thicknesses between the tops of the tallest components 20B and 2C and second sides 17 of their respective boards 16 and 18 (not shown, but see, e.g., the sum of greatest distances T1 and T2). In certain embodiments, one or more additional components 20 on one circuit board may be horizontally offset from components 20 on the other circuit board to reduce the thickness of the circuit board stack (see, e.g., components 20D and 20E).

It is to be noted that, even when the tallest components are placed on their respective boards such that those components are horizontally offset from one another (e.g., components 20B and 20C), other components 20 of the device can be at least partially horizontally aligned. For example, although components 20A and 20F may be at least partially aligned with one another (e.g., by overlapping width W1 in the X-direction), distance D may still be defined by the greatest distance that a component extends from a circuit board (e.g., distance T1) along with minimal vertical offset distance H3. Alternatively, the distances that horizontally overlapping components 20A and 20F extend from their respective circuit boards (e.g., distances T3 and T4) along with minimal vertical offset distance H1 may determine distance D, rather than greatest distance T1 along with minimal vertical offset distance H3. Therefore, in certain embodiments, in order to minimize the thickness of a mated stack, each of the components may be selectively coupled to one of the circuit boards such that, when stacked, the tallest of all the components is substantially adjacent to the circuit board to which it is not coupled. In such an embodiment, the thickness of the stack can be limited only by the height of its tallest component.

As described above, one or more of the plurality of circuit boards of the electronic device may be specifically designed to facilitate one or more specific functions. Such specifically designed boards may be completely independent and may not need or be able to share any capabilities or circuit components with the other board or boards of the device in order to function properly. However, in alternative embodiments, two or more of the circuit boards can be coupled to one another and may share each other's electrical circuit components, thereby essentially combining to form a single circuit board.

For example, as shown in FIGS. 2-6, first side 15 of circuit board 16 can be provided with a board-to-board coupler 26 extending therefrom and first side 15 of circuit board 18 can be provided with a board-to-board coupler 28 extending therefrom. Couplers 26 and 28 can be selectively placed on boards 16 and 18, respectively, such that they are at least partially horizontally aligned. Therefore, when mating components 30 and 40 of device 10 are in their fixed and mated relationship (see, e.g., FIG. 6), board-to-board coupler 26 may be aligned and designed to mate with complimentary board-to-board coupler 28, thereby coupling circuit board 16 to circuit board 18.

Board-to-board couplers 26 and 28 may have electrical contacts that can transmit data to and receive data from each other when they contact one another. The geometries of couplers 26 and 28 can be related to the geometries of mating components 30 and 40 such that the fixed and mated relationship of the mating components holding boards 16 and 18 apart by a distance D allows the electrical contacts of the board-to-board couplers to contact each other (see, e.g., FIG. 6).

In certain embodiments, a shim can be disposed between a circuit board and a board-to-board coupler and/or between two board-to-board couplers to further reinforce the board-to-board connection. For example, as shown in FIGS. 3-6, shim 27, which may be made of any suitable conductive material, can be provided at the end of board-to-board coupler 26 opposite to that of circuit board 16. When boards 16 and 18 are held in their mated relationship (see, e.g., FIG. 6), conductive shim 27 can maintain a conductive pathway between couplers 26 and 28. Conductive shim 27 may also include a compressible material, such as, but not limited to, a gel, foam, or sponge, and/or include a compressive device, such as a spring. The damping effect of the compressible material of shim 27 may protect electronic device 10 from compressive forces applied thereto and ensure that board-to-board couplers 26 and 28 maintain contact. In certain embodiments, compressible shim 27 can augment or absorb any potential compression of the distance between boards 16 and 18 that may occur due to compressive forces of the user sitting on the device, for example.

Electronic devices of the present invention can be designed to transmit and/or receive electromagnetic waves for wireless communication. For example, as mentioned, I/O component 12C of device 10 may be an antenna capable of wirelessly transmitting and/or receiving data (e.g., electromagnetic waves) from a computer or another device. Such electromagnetic waves transmitted or received by components (e.g., antenna 12C) of the device for wireless communications may create electromagnetic interference (EMI) or radio frequency interference (RFI) with other electrical components of the device (e.g., circuit components 20 and boards 16 and 18). Therefore, in certain embodiments, an electronic device can be provided with one or more shields about one or more portions of the circuit boards and their circuit components for shielding against EMI caused by the electromagnetic signals being transmitted and/or received by the device for wireless communications.

In certain embodiments, EMI shields may be provided on or within portions of the device about one or more of the circuit boards. For example, each of side portions 34 and base portion 36 of mating component 30 can be made by, coated with, or attached to an EMI shield or EMI shielding material. Furthermore, each of side portions 44 of mating component 40 can similarly be equipped with an EMI shield or EMI shielding material. Moreover, second side 17 of circuit board 18 can similarly be equipped with an EMI shield or EMI shielding material (see, e.g., EMI shield or EMI shielding material 70 of FIGS. 5 and 6).

Therefore, when boards 16 and 18 are held in their stacked and mated relationship (see, e.g., FIG. 6), electrical circuit components 20 of circuit boards 16 and/or 18 may be partially or completely encapsulated by one or more EMI shields or EMI shielding materials 70. One or more of these EMI shields 70 of device 10 can protect circuit components 20 of both circuit boards 16 and 18 rather than being dedicated to shielding a particular board of the device. This encapsulation of components 20 of mated circuit boards 16 and 18 by one or more shared EMI shields 70 can further reduce the space within device 10 consumed by the circuit board stack.

Figure 8:
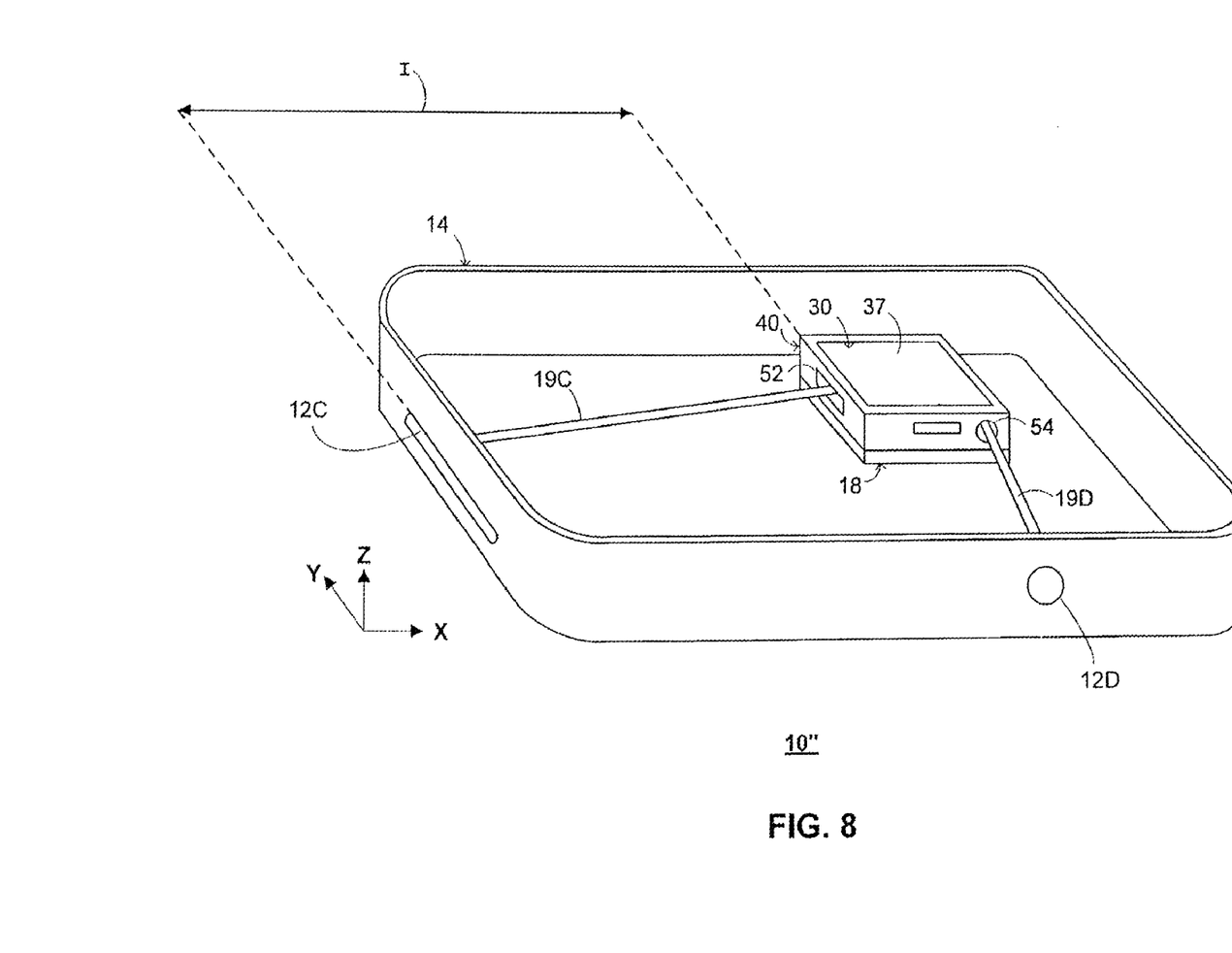
FIG. 8 is a perspective view, similar to FIG. 1, of yet another alternative embodiment of an electronic device in accordance with the principles of the present invention, but with a portion of the housing and I/O components omitted.

While the embodiments of FIGS. 1-7 illustrate circuit board stacks that have substantially the same size as the housing of the device (e.g., housing 14 of FIGS. 1, 6, and 7), the total space consumed by two or more stacked circuit boards may alternatively only take up a fraction of the space provided by the housing. For example, as shown in FIG. 8, a device 10" can be provided that may be substantially the same as device 10 or 10', but whose mated stack of circuit boards 16 and 18 take up only a fraction of the space provided by housing 14.

In certain embodiments, the stacked circuit boards can be significantly spaced from certain other components of the device. For example, as shown in FIG. 8, the mated stack of circuit boards 16 and 18 can be spaced from antenna I/O component 12C by a distance I. This distance may help mitigate any potential EMI involving the electromagnetic signals encapsulated between the mated circuit boards and the electromagnetic signals being transmitted and/or received by the I/O component for wireless communications.

Furthermore, while the embodiments of FIGS. 1-8 illustrate circuit boards having cross-sectional shapes that are substantially rectangular, the cross-sections of the boards may have any shape (e.g., circular or polygonal). Moreover, the shapes of each of any two circuit boards to be mated may vary from one another (e.g., circuit board 16 may be oval and circuit board 18 may be trapezoidal), as long as they can be stacked by appropriately sized and shaped mating components.

Additionally, while the embodiments of FIGS. 1-8 illustrate mated stacks of two circuit boards, various other numbers of circuit boards may be mated and stacked. In one embodiment, a third circuit board can be mated on top of or placed adjacent to two other stacked and mated circuit boards. In an alternative embodiment, a first mated stack of two circuit boards may be mated on top of or adjacent to a second mated stack of two other circuit boards.

While there have been described electronic devices with circuit boards held in a mated stack, it is to be understood that many changes may be made therein without departing from the spirit and scope of the present invention. It will also be understood that various directional and orientational terms such as "horizontal" and "vertical," "top" and "bottom" and "side," "length" and "width" and "height" and "depth" and "thickness," "upper" and "lower," and the like are used herein only for convenience, and that no fixed or absolute directional or orientational limitations are intended by the use of these words. For example, the devices of this invention, as well as their individual components, can have any desired orientation. If reoriented, different directional or orientational terms may need to be used in their description, but that will not alter their fundamental nature as within the scope and spirit of this invention. Moreover, an electronic device constructed in accordance with the principles of the present invention may be of any suitable three-dimensional shape, including, but not limited to, a sphere, cone, octahedron, or combination thereof, rather than a hexahedron, as illustrated by device 10 of FIGS. 1-6. Those skilled in the art will appreciate that the invention can be practiced by other than the described embodiments, which are presented for purposes of illustration rather than of limitation, and the invention is limited only by the claims which follow.

What is claimed is:

1. An electronic device, comprising:
    a first board;
    first circuit components coupled to a first circuitry side of the first board;
    a first board-to-board coupler coupled to the first circuitry side of the first board;
    a second board;
    second circuit components coupled to a second circuitry side of the second board;
    a second board-to-board coupler coupled to the second circuitry side of the second board;
    a first interference shield structure having a first planar portion and first side portions coupled to a first shielding side of the first board opposite the first circuitry side; and
    a second interference shield structure having a second planar portion and second side portions coupled to a second shielding side of the second board opposite the second circuitry side,
    wherein the first and second interference shield structures mate with each other to hold the first board and the second board in a vertical stack, wherein the first and second interference shields substantially surround the first and second circuit components to provide electromagnetic shielding for the first and second circuit components, wherein the first and second board-to-board couplers are electrically connected in the vertical stack, wherein the first circuitry side and the first circuit components face the second circuitry side and the second circuit components in the vertical stack, wherein each of the first circuit components is horizontally offset from each of the second circuit components in the vertical stack, and wherein there is no shielding layer interposed between the facing first and second circuitry sides of the first and second boards.

2. The electronic device of claim 1, wherein the first circuit components comprise a tallest first circuit component and wherein the tallest first circuit component is substantially adjacent to the second board in the vertical stack.

3. The electronic device of claim 1, wherein the first circuit components comprise a tallest first circuit component and wherein the tallest first circuit component is horizontally offset from each of the second circuit components in the vertical stack.

4. The electronic device of claim 1, wherein the first circuit components comprise a tallest first circuit component having a height, wherein the first and second boards are separated by a distance in the vertical stack and wherein the distance between the first and second boards in the vertical stack is substantially equal to the height of the tallest first circuit component.

5. The electronic device of claim 1, further comprising an insulating layer between at least a portion of the first board and at least a portion of the second board in the vertical stack.

6. An electronic device having a housing with a substantially planar surface, comprising:
    a first board within the housing that occupies a region partially overlapping with the planar surface of the housing;
    first circuit components coupled to the first board;
    a first board-to-board coupler coupled to the first board;
    a second board within the housing;
    second circuit components coupled to the second board;
    a second board-to-board coupler coupled to the second board;
    a first interference shield structure having a first planar portion and first side portions coupled to the first board;
    a second interference shield structure having a second planar portion and second side portions coupled to the second board,
    wherein the first and second interference shield structures mate with each other and hold the first and second boards in a stack, wherein the first and second interference shield structures substantially surround the first and second circuit components in the stack, wherein the first and second board-to-board couplers are electrically connected in the stack, wherein the first circuit components face the second circuit components in the stack, wherein each of the first circuit components is horizontally offset from each of the second circuit components in the stack, and wherein there is no shielding layer interposed between the first and second boards; and
    an antenna that is located within the housing and outside the region occupied by the first board.

7. The electronic device of claim 6, wherein the first circuit components extend from the first board towards the second board in the stack and wherein the second circuit components extend from the second board towards the first board in the stack.

8. The electronic device of claim 6, wherein the first and second interference shield structures serve as an electromagnetic shield for the first circuit components in the stack.

9. The electronic device of claim 7, wherein the first and second interference shield structures serve as an electromagnetic shield for the first circuit components in the stack.

10. A method for arranging multiple circuit boards in an electronic device, wherein the device includes a first circuit board with a first interference shield structure having a first planar side and first side portions, a second circuit board with a second interference shield structure having a second planar side and second side portions, first circuit components, and second circuit components, and wherein the first portions have outer sides and the second side portions have inner sides, the method comprising:
   disposing the first circuit components on the first circuit board;
   disposing the second circuit components on the second circuit board;
   disposing the first interference shield structure on the first circuit board;
   disposing the second inference shield structure on the second circuit board; and
   mating the outer sides of the first side portions against the inner sides of the second of the second side portions in a mated configuration that holds the first circuit board and the second circuit board in a vertical stack, wherein the first and second side portions are horizontally offset from one another in the mated configuration, wherein the first circuit components face the second circuit components in the vertical stack, wherein each of the first circuit components is horizontally offset from each of the second circuit components in the vertical stack, wherein the first and second interference shield structures substantially surround the first and second circuit components in the vertical stack to provide electromagnetic shielding for the first and second circuit components, and wherein there is no shielding layer interposed between the first circuit components and the second circuit components.

11. The method of claim 10, wherein the second circuit components comprise a tallest circuit component and wherein disposing the second circuit components comprises selectively placing the second circuit components in a configuration that horizontally offsets the tallest circuit component from each of the first circuit components in the vertical stack.

12. The electronic device defined in claim 1, wherein the first circuit components comprise a tallest first circuit component having a first height, wherein the second circuit components comprise a tallest second circuit component having a second height, wherein the first and second boards are separated by a distance in the vertical stack, and wherein the distance between the first and second boards in the vertical stack is less than a sum of the first and second heights.

13. The electronic device defined in claim 6, wherein the first circuit components comprise a tallest first circuit component having a first height, wherein the second circuit components comprise a tallest second circuit component having a second height, wherein the first and second boards are separated by a distance in the stack, and wherein the distance between the first and second boards in the stack is less than a sum of the first and second heights.

14. The method defined in claim 10 wherein the first circuit components comprise a tallest first circuit component having a first height and wherein the second circuit components comprise a tallest second circuit component having a second height, the method further comprising:
   separating the first and second boards by a distance in the vertical stack; and
   disposing the first and second boards so that the distance between the first and second boards in the vertical stack is less than a sum of the first and second heights.

* * * * *

UNITED STATES PATENT AND TRADEMARK OFFICE
CERTIFICATE OF CORRECTION

PATENT NO.        : 7,729,131 B2  
APPLICATION NO.   : 11/650122  
DATED             : June 1, 2010  
INVENTOR(S)       : Erik L. Wang et al.

Page 1 of 1

It is certified that error appears in the above-identified patent and that said Letters Patent is hereby corrected as shown below:

Title page, item [75] (Inventors), line 2, delete "Sangunietti" and insert -- Sanguinetti --

In column 8, line 1, delete "D1" and insert -- D' --

Signed and Sealed this  
Twenty-fifth Day of October, 2011

David J. Kappos  
*Director of the United States Patent and Trademark Office*